(12) United States Patent
Tobe et al.

(10) Patent No.: US 8,728,870 B2
(45) Date of Patent: May 20, 2014

(54) THIN FILM SILICON WAFER AND METHOD FOR MANUFACTURING THE SAME

(75) Inventors: Satoshi Tobe, Gunma (JP); Takao Takenaka, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 549 days.

(21) Appl. No.: 12/664,232

(22) PCT Filed: Jun. 4, 2008

(86) PCT No.: PCT/JP2008/060263
§ 371 (c)(1),
(2), (4) Date: Dec. 11, 2009

(87) PCT Pub. No.: WO2009/004889
PCT Pub. Date: Jan. 8, 2009

(65) Prior Publication Data
US 2010/0171195 A1 Jul. 8, 2010

(30) Foreign Application Priority Data
Jul. 4, 2007 (JP) ................................ 2007-176310

(51) Int. Cl.
*H01L 25/065* (2006.01)
(52) U.S. Cl.
USPC ........................................ 438/121; 257/618
(58) Field of Classification Search
USPC .......... 257/618, 632, 686; 438/471–475, 121, 438/109
See application file for complete search history.

(56) References Cited

U.S. PATENT DOCUMENTS

| 6,005,335 A | * | 12/1999 | Potter ............................ 313/309 |
| 6,083,324 A | * | 7/2000 | Henley et al. ................ 148/33.2 |
| 6,774,435 B1 | * | 8/2004 | Matsumoto et al. .......... 257/347 |

(Continued)

FOREIGN PATENT DOCUMENTS

| EP | 1 610 370 A2 | 12/2005 | |
| JP | 04030561 A | * 2/1992 | .............. H01L 23/50 |
| JP | 2005-317735 A | 11/2005 | |
| JP | 2005-317805 A | 11/2005 | |
| JP | 2006-005063 A | 1/2006 | |

OTHER PUBLICATIONS

PCT/ISA/210 International Search Report, App. No. PCT/JP2008/060263, Aug. 26, 2008 (1 page).

(Continued)

*Primary Examiner* — Marcos D. Pizarro
*Assistant Examiner* — Sue Tang
(74) *Attorney, Agent, or Firm* — Rader, Fishman & Grauer PLLC

(57) ABSTRACT

Provided are a thin film silicon wafer having high gettering capability, a manufacturing method therefor, a multi-layered silicon wafer formed by laminating the thin film silicon wafers, and a manufacturing method therefor. The thin film silicon wafer is manufactured by: forming one or more gettering layers immediately below a device layer which is formed in a vicinity of a front surface of a semiconductor silicon wafer; fabricating a device in the device layer of the semiconductor silicon wafer; and after the device has been fabricated, removing part of the semiconductor silicon wafer from a rear surface thereof to immediately below the gettering layers so as to leave at least one of the gettering layers in place. As a result, the thin film silicon wafer is allowed to have gettering capability even after having been reduced in thickness to be in a thin film form.

4 Claims, 9 Drawing Sheets

(56) References Cited

U.S. PATENT DOCUMENTS

2004/0097055 A1\* 5/2004 Henley et al. ............. 438/471
2005/0245052 A1   11/2005 Inoue
2005/0280122 A1\* 12/2005 Arimura ................... 257/632

OTHER PUBLICATIONS

PCT/IB/338, App. No. PCT/JP2008/060263, English Translation of the Int'l Preliminary Report, Feb. 4, 2010, PCT/IB/373, PCT/ISA/237 (6 pages).

\* cited by examiner

FIG.2
(a)
(b)

THIN FILM SILICON WAFER AND METHOD FOR MANUFACTURING THE SAME

TECHNICAL FIELD

The present invention relates to a gettering method, which is a technology of removing heavy metal impurities that have an adverse effect on device operations in a semiconductor silicon single crystalline substrate, and to a thin film silicon wafer having high gettering capability, a manufacturing method therefor, a multi-layered silicon wafer formed by laminating the thin film silicon wafers, and a manufacturing method therefor.

BACKGROUND ART

Along with higher densification and higher integration of devices including semiconductor integrated circuits, there is a rapidly increasing demand for stabilization of device operations. In particular, improvement in characteristic values with regard to leakage current, oxide dielectric breakdown strength, and the like is an important problem.

However, even now, the fear of contamination by such undesirable heavy metals as impurities of Cu, Fe, Ni, and the like remains undenied in manufacturing steps for the semiconductor integrated circuit. It is widely known that those heavy metal impurities which exist as a solid solution state in a silicon single crystal significantly deteriorate the above-mentioned characteristics of leakage current and oxide dielectric breakdown strength.

Accordingly, various gettering technologies have been developed as a way to remove those heavy metal impurities out of a device operating region. There are known, for example, an internal gettering (IG) method wherein oxygen atoms contained in a silicon single crystal that has been manufactured through a CZ method are precipitated as oxygen precipitates to capture heavy metals within strains around the precipitates, a method wherein elements of some kind are ion-implanted into a vicinity of device layers to generate intentionally strains or defect layers and heavy metals are gettered into the strains or defect layers, and a method wherein a polycrystalline silicon film is formed on a rear surface of a silicon wafer so as to capture heavy metal impurities with strains generated in polycrystalline grain boundaries.

DISCLOSURE OF THE INVENTION

Problems to be Solved by the Invention

However, in a recent device structure such as a multi-chip device in which high integration is achieved by reducing a device formation layer in thickness to make a thin film and laminating and depositing a number of the thin films, even if a gettering layer has been formed in advance in the interior of a silicon wafer or on a rear surface thereof, the gettering layer is peeled off at a stage of making the thin film, which causes gettering capability thereof to be lost after the multi-layered structure has been formed. Even if gettering capability is imparted to a lowermost layer position of the multi-layered wafer, it is necessary that impurities in a vicinity of a front surface layer of the multi-layered wafer permeate through a plurality of device layers in order to be gettered to a rear surface layer thereof.

The present invention has been made in view of the problems, and has an object of providing a thin film silicon wafer having high gettering capability, a manufacturing method therefor, a multi-layered silicon wafer formed by laminating the thin film silicon wafers, and a manufacturing method therefor, based on knowledge that, in a silicon wafer having a multi-layered structure in which device layers of thin films are laminated, there is effective a structure in which gettering capability is imparted to each of the device layers, and there is also effective a method in which a plurality of layers each having gettering capability (hereinafter simply referred to as gettering layers) are imparted to each of the thin film silicon wafers, and unnecessary impurities are collected together in the gettering layers before making the thin films from the device layer so that the impurities captured in the gettering layers are removed together the layers when making the thin films, because the method is capable of reducing the fear that recontamination may occur at a later stage. The present invention also has an object of providing a thin film silicon wafer, a manufacturing method therefor, a multi-layered silicon wafer formed by laminating the thin film silicon wafers, and a manufacturing method therefor, which are capable of providing gettering capability even against elements causing contamination after the thin film silicon wafers have been deposited to form the multi-layered structure by leaving at least one of a plurality of formed gettering layers in place.

Means for Solving the Problems

A thin film silicon wafer according to the present invention has gettering capability even after having been reduced in thickness to be in a thin film form, the thin film silicon wafer being manufactured by: forming one or more gettering layers immediately below a device layer which is formed in a vicinity of a front surface of a semiconductor silicon wafer; fabricating a device in the device layer of the semiconductor silicon wafer; and after the device has been fabricated, removing part of the semiconductor silicon wafer from a rear surface of the semiconductor silicon wafer to immediately below the gettering layers so as to leave at least one of the gettering layers in place.

A manufacturing method for a thin film silicon wafer which has gettering capability even after having been reduced in thickness to be in a thin film form according to the present invention includes the steps of: forming one or more gettering layers immediately below a device layer which is formed in a vicinity of a front surface of a semiconductor silicon wafer; fabricating a device in the device layer of the semiconductor silicon wafer; and after the device has been fabricated, removing part of the semiconductor silicon wafer from a rear surface of the semiconductor silicon wafer to immediately below the gettering layers so as to leave at least one of the gettering layers in place.

A multi-layered silicon wafer structure according to the present invention has a structure in which: a plurality of the thin film silicon wafers according to the present invention are laminated in layers; each of the laminated layers includes an individual device; and gettering layers are provided immediately below all of the layers including the individual devices.

A manufacturing method for a multi-layered silicon wafer structure according to the present invention includes the step of laminating in layers a plurality of the thin film silicon wafers according to the present invention, to thereby manufacture the multi-layered silicon wafer structure in which each of the laminated layers includes an individual device, and gettering layers are provided immediately below all of the layers including the individual devices.

A multi-layered silicon wafer according to the present invention is manufactured by laminating a plurality of thin film silicon wafers, each of the thin film silicon wafers being manufactured by: forming a plurality of gettering layers immediately below a device layer which is formed in a vicinity of a front surface of a semiconductor silicon wafer; fabricating a device in the device layer of the semiconductor silicon wafer; after the device has been fabricated, capturing impurity elements within the gettering layers by performing gettering heat treatment on the semiconductor silicon wafer; and after the gettering heat treatment has been performed, removing part of the semiconductor silicon wafer from a rear surface of the semiconductor silicon wafer to immediately below the gettering layers together with the getting layers containing the impurity elements so as to leave at least one of the plurality of gettering layers in place.

A manufacturing method for a multi-layered silicon wafer according to the present invention includes the steps of: forming a plurality of gettering layers immediately below a device layer which is formed in a vicinity of a front surface of a semiconductor silicon wafer; fabricating a device in the device layer of the semiconductor silicon wafer; after the device has been fabricated, capturing impurity elements within the gettering layers by performing gettering heat treatment on the semiconductor silicon wafer; after the gettering heat treatment has been performed, removing part of the semiconductor silicon wafer from a rear surface of the semiconductor silicon wafer to immediately below the gettering layers together with the getting layers containing the impurity elements so as to leave at least one of the plurality of gettering layers in place, to thereby manufacture a thin film silicon wafer; and laminating a plurality of the thin film silicon wafers, to thereby manufacture the multi-layered silicon wafer.

Result of the Invention

As has been described above, with the thin film silicon wafer and the multi-layered silicon wafer according to the present invention, the gettering technique which is effective in both stages before and after being reduced in thickness to be in a thin film form can be provided for impurity contamination which may be a weak point of the multi-layered device structure in which high integration is achieved. Further, the methods according to the present invention have advantages of efficiently manufacturing the thin film silicon wafer and the multi-layered silicon wafer of the present invention, respectively.

BRIEF DESCRIPTION OF THE DRAWINGS

FIG. 2 are schematic explanatory diagrams illustrating a structural example of the thin film silicon wafer according to the present invention, in which FIG. 2(a) illustrates a first structural example and FIG. 2(b) illustrates a second structural example.

FIG. 7 are schematic explanatory diagrams illustrating an example of a manufacturing procedure for the multi-layered silicon wafer according to the present invention, in which FIG. 7(a) illustrates a state in which a device layer, a first gettering layer, and a second gettering layer have been formed on a front surface side of a semiconductor silicon wafer, FIG. 7(b) illustrates a state in which a removal part and the first gettering layer have been removed from a rear surface side of the semiconductor silicon wafer in the state of FIG. 7(a), and FIG. 7(c) illustrates a state in which three thin film silicon wafers have been bonded together.

FIG. 9 are schematic explanatory diagrams illustrating an example of a manufacturing procedure for a multi-layered silicon wafer sample according to Comparative Example 1, in which FIG. 9(a) illustrates a state in which the device layer and the first gettering layer have been formed on the front surface side of the semiconductor silicon wafer, FIG. 9(b) illustrates a state in which the removal part and the first gettering layer have been removed from the rear surface side of the semiconductor silicon wafer in the state of FIG. 9(a), and FIG. 9(c) illustrates a state in which three thin film silicon wafers have been bonded together.

FIG. 10 are schematic explanatory diagrams illustrating an example of a manufacturing procedure for a multi-layered silicon wafer sample according to Comparative Example 2, in which FIG. 10(a) illustrates a state in which the device layer has been formed on the front surface side of the semiconductor silicon wafer, FIG. 10(b) illustrates a state in which the removal part has been removed from the rear surface side of the semiconductor silicon wafer in the state of FIG. 10(a), and FIG. 10(c) illustrates a state in which three thin film silicon wafers have been bonded together.

DESCRIPTION OF SYMBOLS 10, 10A, 10B, 10C: thin film silicon wafers, 12: a semiconductor silicon wafer, 12A, 12B, 12C: initial wafers, 14, 14A to 14F: device layers, 16, 16A to 16F, 16a, 16b, 17: gettering layers, 18: a removal part, 20: a multi-layered silicon wafer structure, 30, 40: multi-layered silicon wafers

BEST MODE FOR CARRING OUT THE INVENTION

Hereinafter, embodiments of the present invention are described with reference to the accompanying drawings. However, those embodiments are merely illustrative, and it should be understood that various modifications may made thereto without departing from the technical concept of the present invention.

Figure 1:
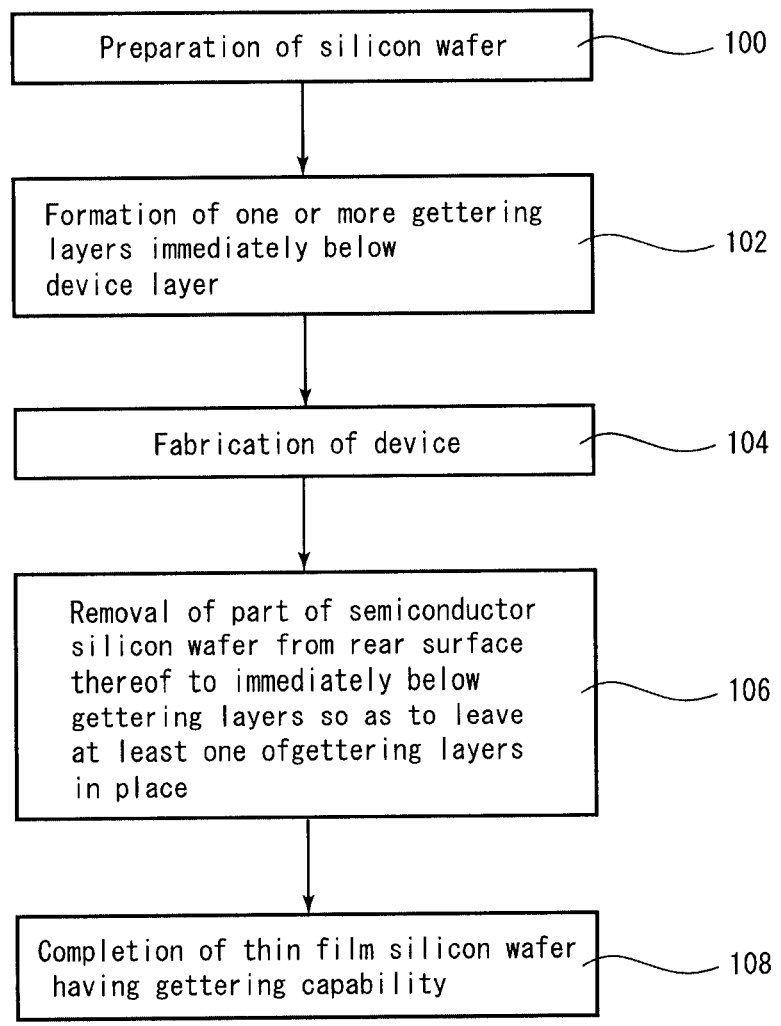
FIG. 1 is a flow chart illustrating an example of a step sequence for a thin film silicon wafer according to the present invention.

A manufacturing method for a thin film silicon wafer according to the present invention includes manufacturing steps illustrated in FIG. 1. FIG. 1 is a flow chart illustrating an example of a manufacturing step sequence for the thin film silicon wafer according to the present invention. First, a semiconductor silicon wafer is prepared (Step 100 of FIG. 1). Next, one or more gettering layers are formed immediately below a device layer which is formed in a vicinity of a front surface of the semiconductor silicon wafer (Step 102 of FIG. 1). Subsequently, a device is fabricated in the device layer of the semiconductor silicon wafer (Step 104 of FIG. 1). After the device has been fabricated, part of the semiconductor silicon wafer from a rear surface thereof to immediately below the gettering layers is removed so as to leave at least one of the gettering layers in place (Step 106 of FIG. 1). Through the procedure described above, a thin film silicon wafer 10 according to the present invention is manufactured (Step 108 of FIG. 1).

According to one aspect of the thin film silicon wafer 10, the thin film silicon wafer 10 has a structure in which one gettering layer 16 is provided immediately below a device layer 14 formed in a vicinity of a front surface layer of a semiconductor silicon wafer 12, as illustrated in FIG. 2(a). In FIG. 2, reference numeral 18 denotes a removal part to be removed from a rear surface side of the semiconductor silicon wafer 12 after the gettering layer 16 has been formed. Further, according to another aspect of the thin film silicon wafer 10, the thin film silicon wafer 10 has a structure in which a plurality of gettering layers (two layers in the illustrated example) 16 and 17 are provided immediately below the device layer 14 formed in the vicinity of the front surface layer of the semiconductor silicon wafer 12, as illustrated in FIG. 2(b). In the case of FIG. 2(b), the gettering layer 17 and the removal part 18 are to be removed.

Figure 3:
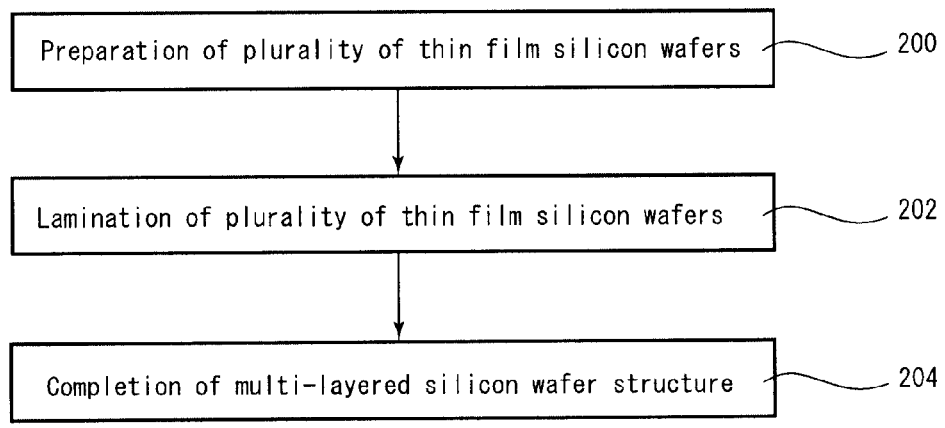
FIG. 3 is a flow chart illustrating an example of a manufacturing step sequence for a multi-layered silicon wafer structure according to the present invention.

A manufacturing method for a multi-layered silicon wafer structure according to the present invention includes a manufacturing procedure illustrated in FIG. 3. FIG. 3 is a flow chart illustrating an example of a manufacturing step sequence for the multi-layered silicon wafer structure according to the present invention. First, a plurality of the thin film silicon wafers 10 each having the above-mentioned structure are prepared (Step 200 of FIG. 3). Next, the plurality of the thin film silicon wafers are laminated (Step 202 of FIG. 3). Through the procedure described above, a multi-layered silicon wafer structure 20 according to the present invention is manufactured (Step 204 of FIG. 3).

Figure 4:
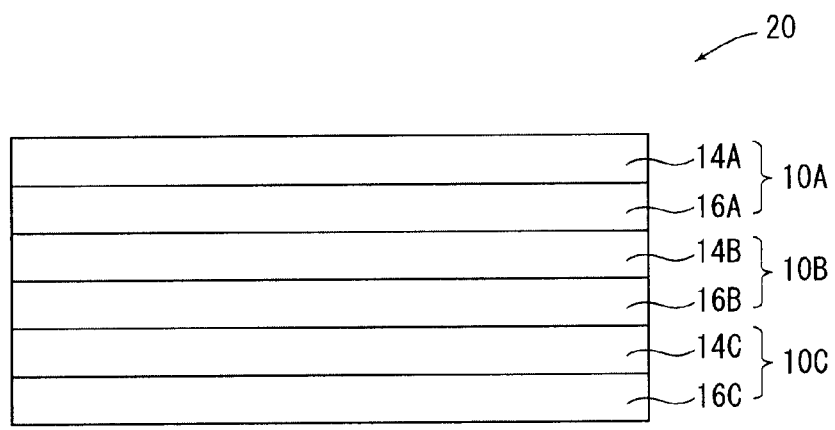
FIG. 4 is a schematic explanatory diagram illustrating an example of a structure of the multi-layered silicon wafer structure according to the present invention.

In the multi-layered silicon wafer structure 20, as illustrated in FIG. 4, each of laminated thin film silicon wafers 10A, 10B, and 10C includes an individual device, and gettering layers 16A, 16B, and 16C are provided immediately below all of device layers 14A, 14B, and 14C including the individual devices. Note that the illustrated example of the multi-layered silicon wafer structure 20 of FIG. 4 illustrates the case where the three thin film silicon wafers are laminated.

Figure 5:
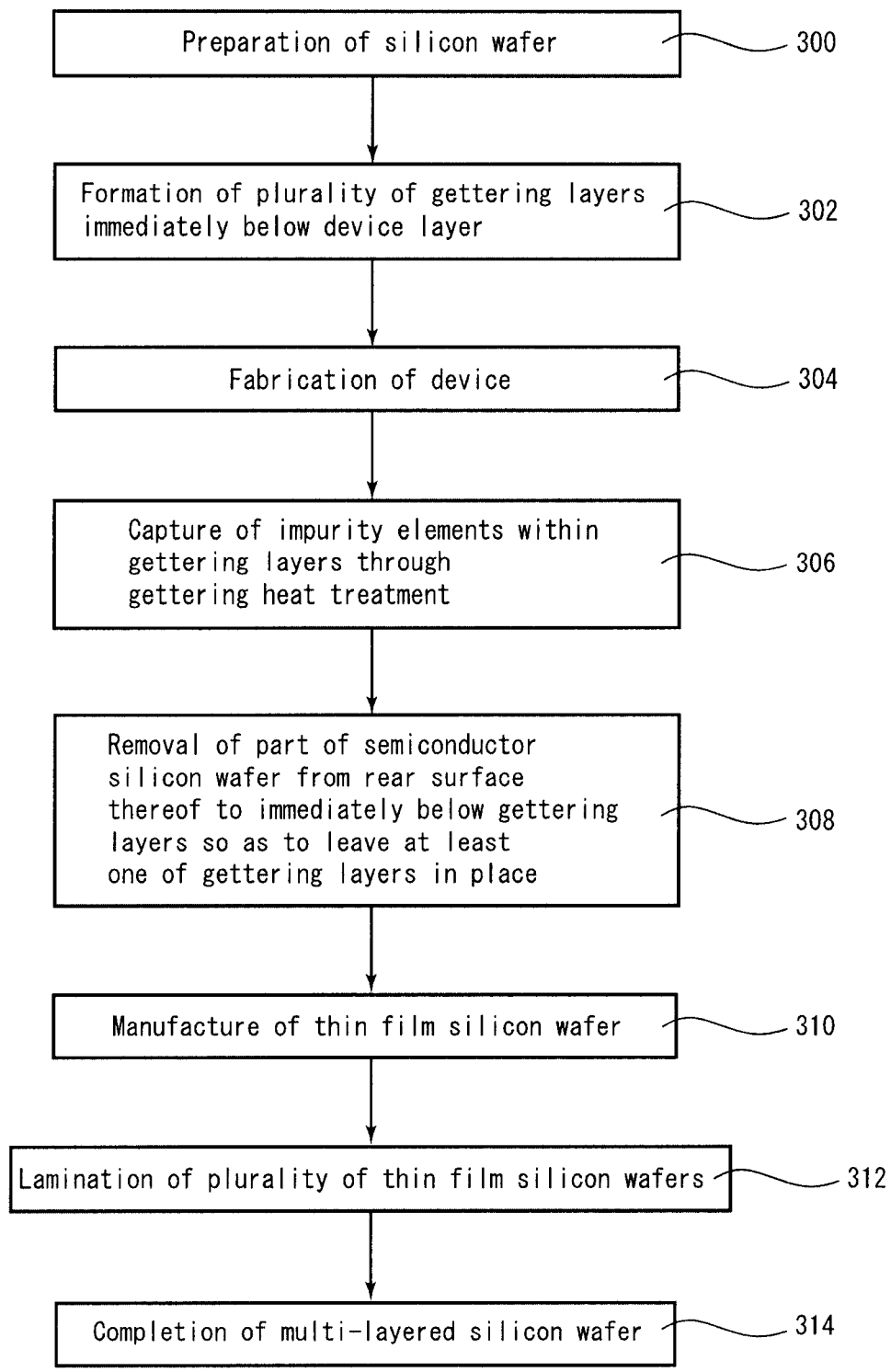
FIG. 5 is a flow chart illustrating an example of a manufacturing step sequence for a multi-layered silicon wafer according to the present invention.

A manufacturing method for a multi-layered silicon wafer according to the present invention includes a manufacturing procedure illustrated in FIG. 5. FIG. 5 is a flow chart illustrating an example of a manufacturing step sequence for the multi-layered silicon wafer according to the present invention. First, a semiconductor silicon wafer is prepared (Step 300 of FIG. 5). Next, a plurality of gettering layers are formed immediately below a device layer which is formed in a vicinity of a front surface of the semiconductor silicon wafer (Step 302 of FIG. 5). Subsequently, a device is fabricated in the device layer of the semiconductor silicon wafer (Step 304 of FIG. 5). After the device has been fabricated, gettering heat treatment is performed on the semiconductor silicon wafer, to thereby capture impurity elements within the gettering layers (Step 306 of FIG. 5). After the gettering heat treatment has been performed, part of the semiconductor silicon wafer from a rear surface thereof to immediately below the gettering layers is removed together with the getting layers containing the impurity elements so as to leave at least one of the plurality of gettering layers in place (Step 308 of FIG. 5). Through the procedure described above, a thin film silicon wafer is manufactured (Step 310 of FIG. 5). A plurality of the thin film silicon wafers are laminated (Step 312 of FIG. 5). Through the laminating process, a multi-layered silicon wafer 30 according to the present invention is completed (Step 314 of FIG. 5).

Figure 6:
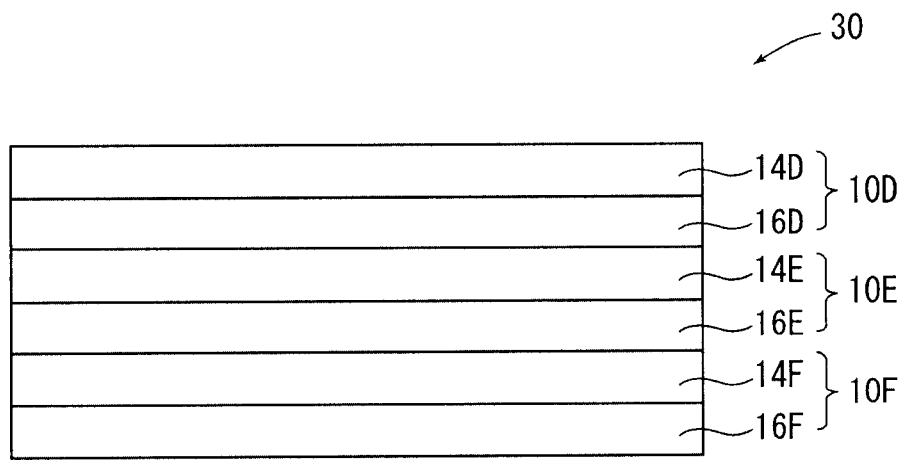
FIG. 6 is a schematic explanatory diagram illustrating an example of a structure of the multi-layered silicon wafer according to the present invention.

In the multi-layered silicon wafer 30, as illustrated in FIG. 6, each of laminated layers 10D, 10E, and 10F includes an individual device, and gettering layers 16D, 16E, and 16F which have captured the impurity elements are provided immediately below all of device layers 14D, 14E, and 14F including the individual devices. Note that the illustrated example of the multi-layered silicon wafer 30 of FIG. 6 illustrates the case where the three thin film silicon wafers are laminated.

Figure 7:
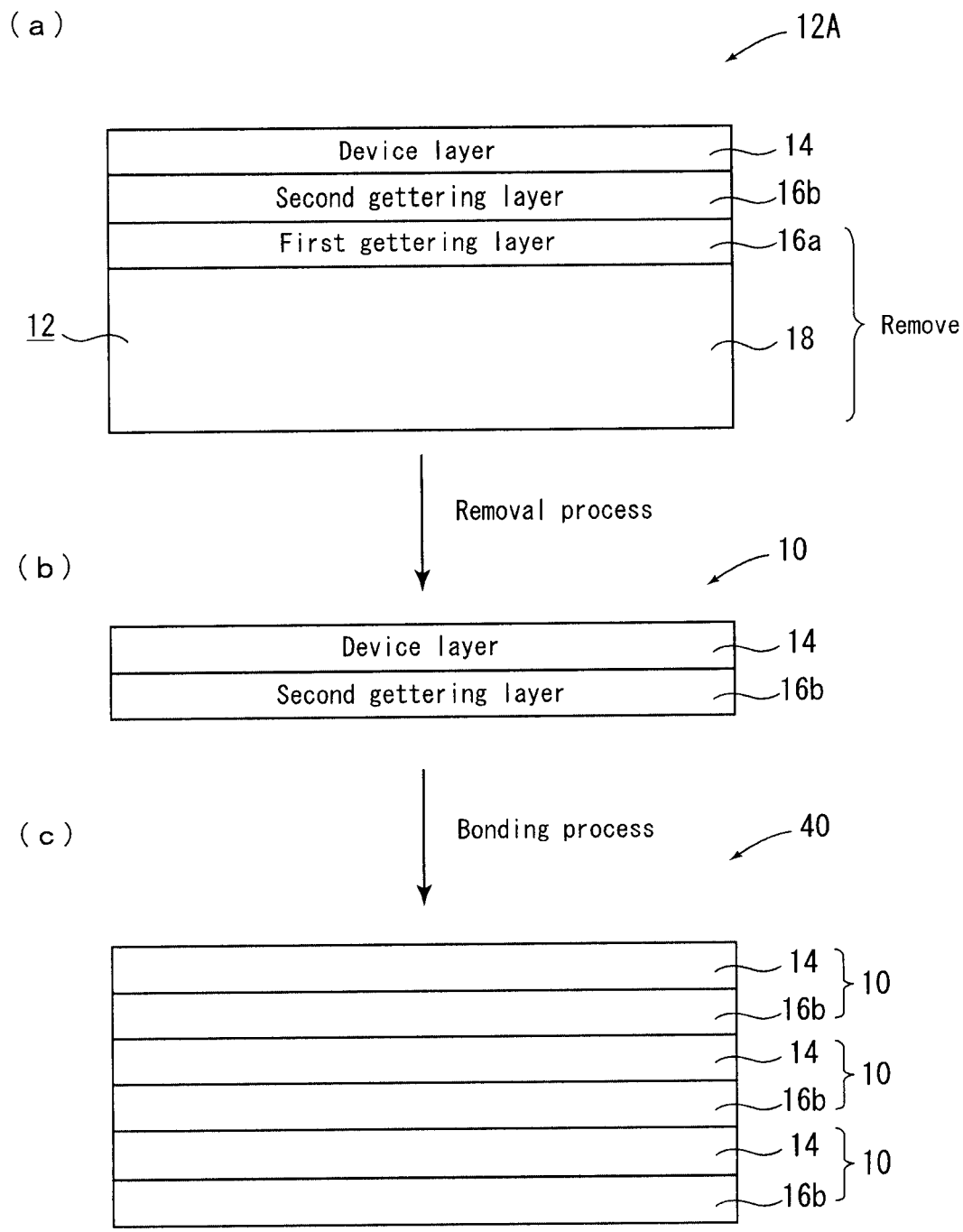

Hereinafter, the manufacturing procedure for the multi-layered silicon wafer according to the present invention is described more specifically. FIG. 7 are schematic explanatory diagrams illustrating an example of the manufacturing procedure for the multi-layered silicon wafer according to the present invention. FIG. 7(a) illustrates a state in which a device layer, a first gettering layer, and a second gettering layer have been formed on a front surface side of a semiconductor silicon wafer, FIG. 7(b) illustrates a state in which a removal part and the first gettering layer have been removed from a rear surface side of the semiconductor silicon wafer in the state of FIG. 7(a), and FIG. 7(c) illustrates a state in which three thin film silicon wafers have been bonded together. In this example, as illustrated in FIG. 7(a), the two gettering layers 16a and 16b are provided when each of the thin film silicon wafers 10 is manufactured. Such a technique capable of performing gettering over a relatively wider area is used for the first gettering layer 16a as to be a high concentration boron layer ($p^+$ layer) or a layer having high BMD density (IG layer: Internal Gettering layer). The second gettering layer 16b is an ion-implantation layer, and as to the second gettering layer 16b, on the assumption that the device layer 14 is normally formed in the vicinity of the front surface layer of the semiconductor silicon wafer 12, there is used a technique capable of forming a gettering layer over a relatively narrower area so as to be formed at a depth position of several m from the front surface layer.

As described above, the first gettering layer 16a and the second gettering layer 16b are formed on the front surface side of the semiconductor silicon wafer (FIG. 7(a)). For convenience of description in Example 1, the silicon wafer in this state is referred to as an initial wafer 12A. Next, after a device has been fabricated in the device layer 14, the first gettering layer 16a and the removal part 18 are removed (FIG. 7(b)). A plurality of the thin film silicon wafers 10 thus manufactured (three in the illustrated example) are bonded together, to thereby complete a multi-layered silicon wafer 40 according to the present invention (FIG. 7(c)).

EXAMPLES

Hereinafter, while description will be given of the present invention in more concrete manner taking up examples below, it is needless to say that the examples are shown by way of illustration only and should not be construed by way of limitation.

Example 1

The multi-layered silicon wafer having the structure illustrated in FIG. 7(c) was manufactured. Note that, in this example, the first gettering layer is a high concentration boron layer while the second gettering layer is a layer formed by performing ion-implantation of B at 2 MeV and with a dose of $10^{15}$ cm$^{-2}$. Gettering capability evaluation was performed on this wafer through intentional contamination.

Figure 8:
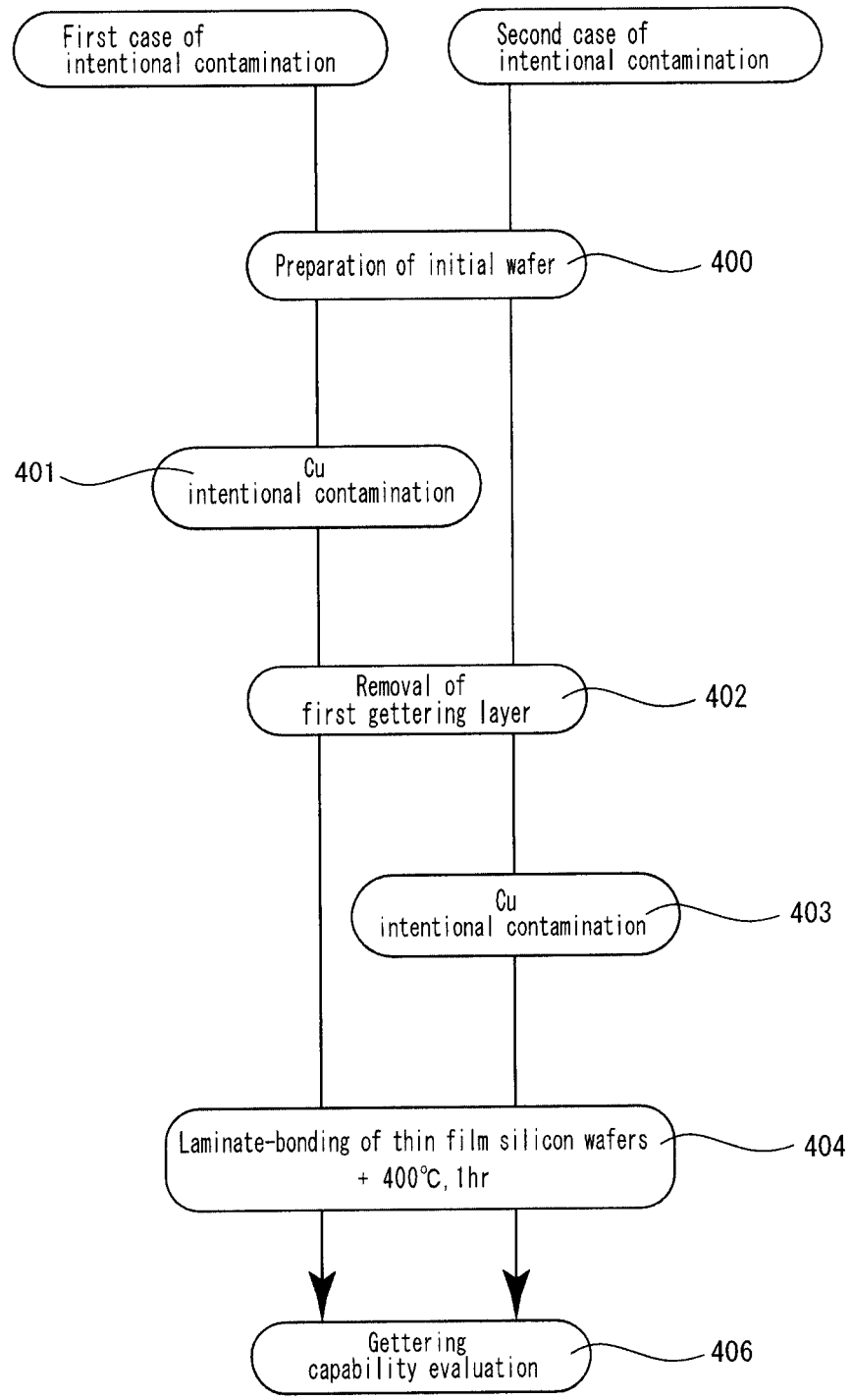
FIG. 8 is a flow chart illustrating step sequences for two intentional contamination steps of Example 1, Comparative Example 1, and Comparative Example 2 together.

In this example, in a lamination bonding step for the thin film silicon wafers, two situations were prepared for an intentional contamination step. FIG. 8 is a flow chart illustrating step sequences for the two intentional contamination steps together. In the first case of intentional contamination, first, the initial wafer 12A (in the state in which the first gettering layer and the second gettering layer were formed on the semiconductor silicon wafer but the first gettering layer had not yet been removed, that is, in the state of FIG. 7(*a*)) was prepared (Step 400 of FIG. 8). The initial wafer 12A was intentionally contaminated with Cu at a concentration of 4×10$^{12}$ cm$^{-3}$ (Step 401 of FIG. 8), and the first gettering layer 16*a* was removed (Step 402 of FIG. 8). A plurality of the thin film silicon wafers in this state (three in this example) were laminated and deposited, and heat treatment was performed thereon for one hour at 400° C. (Step 404 of FIG. 8). Thereafter, a Cu concentration in the vicinity of the front surface layer was evaluated by a chemical analysis method, to thereby perform gettering capability evaluation (Step 406 of FIG. 8).

In contrast to this, the second case of intentional contamination is different from the first case of intentional contamination in that the initial wafer 12A was not intentionally contaminated and that the thin film silicon wafer being a thinned layer after the first gettering layer had been ground to be removed (in the state of FIG. 7(*b*)) was intentionally contaminated with Cu at a concentration of 4×10$^{12}$ cm$^{-3}$ (Step 403 of FIG. 8). However, the remaining procedure is identical with the first case of intentional contamination, and hence repetitive description is omitted.

Comparative Example 1

Figure 9:
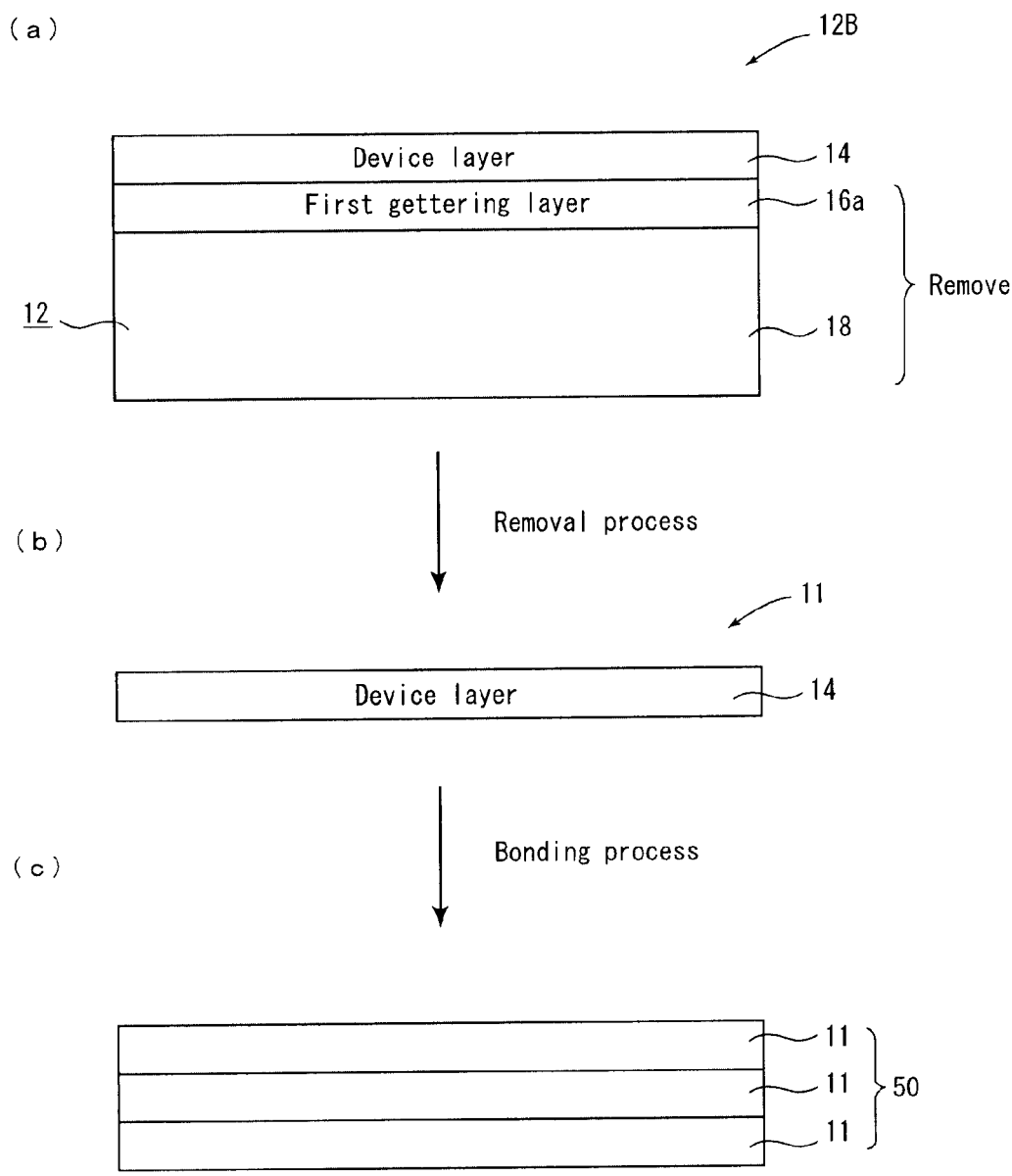

In this comparative example, there was used a sample in which only the first gettering layer was formed while no second gettering layer was formed in the manufacturing example of Example 1 illustrated in FIG. 7. A manufacturing procedure for the sample is illustrated in FIG. 9. FIG. 9 are schematic explanatory diagrams illustrating an example of the manufacturing procedure for the multi-layered silicon wafer sample according to Comparative Example 1. FIG. 9(*a*) illustrates a state in which the device layer and the first gettering layer have been formed on the front surface side of the semiconductor silicon wafer, FIG. 9(*b*) illustrates a state in which the removal part and the first gettering layer have been removed from the rear surface side of the semiconductor silicon wafer in the state of FIG. 9(*a*), and FIG. 9(*c*) illustrates a state in which three thin film silicon wafers have been bonded together.

As described above, in manufacturing the sample of Comparative Example 1 of FIG. 9, only the first gettering layer 16*a* is formed on the front surface side of the semiconductor silicon wafer 12 to form an initial wafer 12B (FIG. 9(*a*)), and after a device has been fabricated in the device layer 14, the first gettering layer 16*a* and the removal part 18 are removed (FIG. 9(*b*)). A plurality of thin film silicon wafers 11 thus manufactured (three in the illustrated example) were laminated to be bonded together, to thereby manufacture a multi-layered silicon wafer 50 according to Comparative Example 1 (FIG. 9(*c*)). Gettering capability evaluation was performed on this wafer through intentional contamination similarly to Example 1. Note that the initial wafer 12B was used as the initial wafer of the flow chart of FIG. 8.

Comparative Example 2

Figure 10:
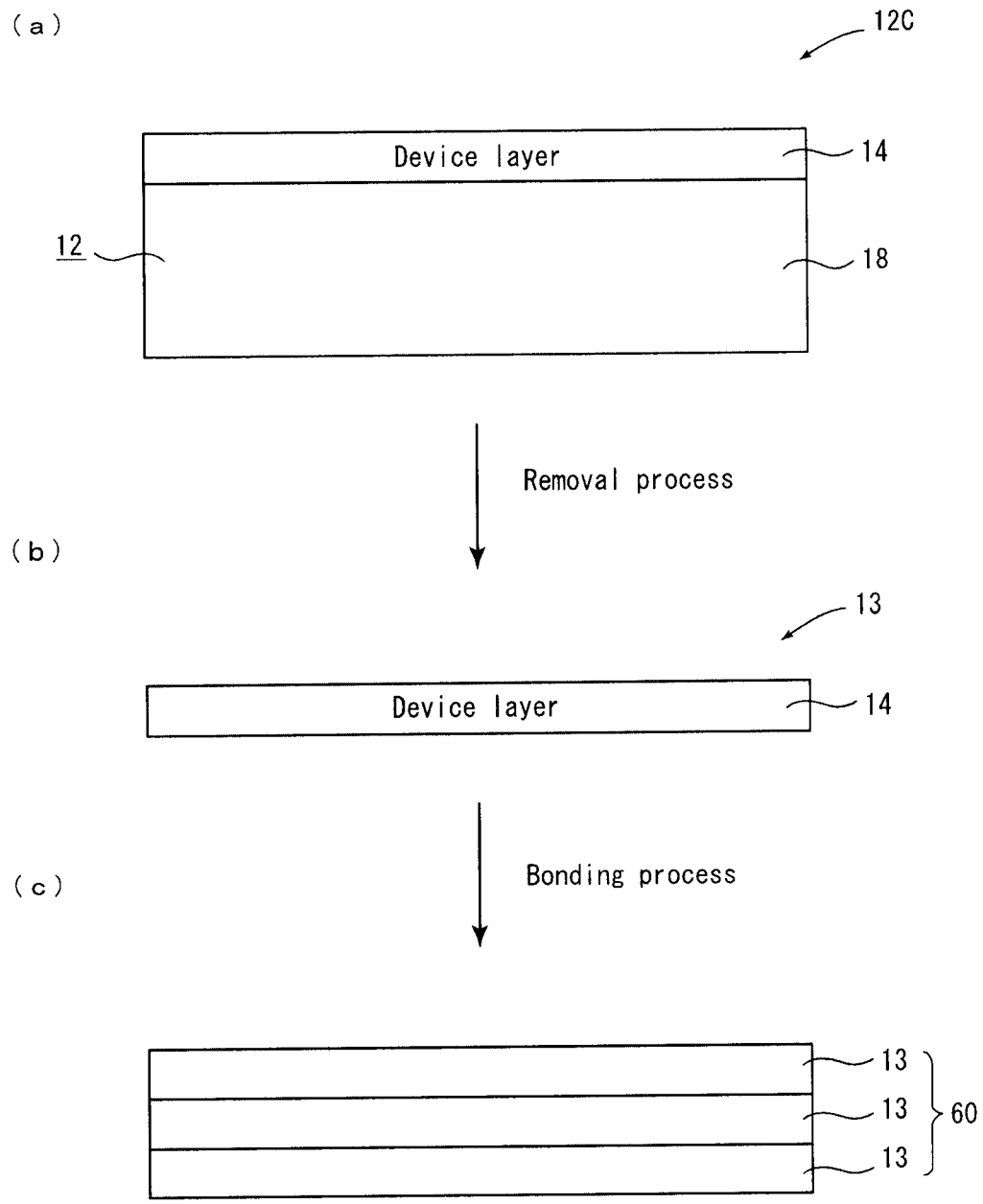

In this comparative example, there was used a sample in which neither the first gettering layer nor the second gettering layer was formed in the manufacturing example of Example 1 illustrated in FIG. 7. A manufacturing procedure for the sample is illustrated in FIG. 10. FIG. 10 are schematic explanatory diagrams illustrating an example of the manufacturing procedure for the multi-layered silicon wafer sample according to Comparative Example 2. FIG. 10(*a*) illustrates a state in which the device layer has been formed on the front surface side of the semiconductor silicon wafer, FIG. 10(*b*) illustrates a state in which the removal part has been removed from the rear surface side of the semiconductor silicon wafer in the state of FIG. 10(*a*), and FIG. 10(*c*) illustrates a state in which three thin film silicon wafers have been bonded together.

As described above, in manufacturing the sample of Comparative Example 2 of FIG. 10, no gettering layer is formed on the front surface side of the semiconductor silicon wafer, and the wafer in this state is referred to as an initial wafer 12C (FIG. 10(*a*)). Next, after a device has been fabricated in the device layer 14, the removal part 18 is removed (FIG. 10(*b*)). A plurality of thin film silicon wafers 13 thus manufactured (three in the illustrated example) are laminated to be bonded together, to thereby manufacture a multi-layered silicon wafer 60 according to Comparative Example 2 (FIG. 10(*c*)). Gettering capability evaluation was performed on this wafer through intentional contamination similarly to Example 1. Note that the initial wafer 12C was used as the initial wafer of the flow chart of FIG. 8. Further, because the initial wafer 12C includes no first gettering layer, it is the removal part 18 that is removed in a process corresponding to that of Step 402 of FIG. 8.

Results of the gettering capability evaluation according to Example 1, Comparative Example 1, and Comparative Example 2 are illustrated in Table 1. As to Example 1, it is found that the Cu concentrations in the vicinity of the front surface layer are equal to or lower than a detection lower limit value, irrespective of the situations in which the contamination steps have been performed, and that the gettering effectively worked against contamination by Cu at any stage of the multi-layered wafer formation process. In contrast to this, as to Comparative Example 1, the gettering does not work at all against the contamination in the second contamination step, that is, after the first gettering layer has been peeled off, which results in detection of Cu in the vicinity of the front surface layer. As to Comparative Example 2, because the wafer including no gettering layer is used in all steps, the gettering does not work, which makes high the Cu concentrations in the vicinity of the front surface layer not depending on the situations of the contamination steps.

TABLE 1

|  | Cu concentration in vicinity of front surface layer (cm$^{-3}$) | |
|---|---|---|
|  | Contamination before removal of first gettering layer (first case) | Contamination after removal of first gettering layer (second case) |
| Example | D.L. | D.L. |
| Comparative Example 1 (only with p$^+$ layer of first layer) | D.L. | 4 × 10$^{12}$(cm$^{-3}$) |
| Comparative Example 2 (with no gettering layer) | 4 × 10$^{12}$(cm$^{-3}$) | 4 × 10$^{12}$(cm$^{-3}$) |

Initial contamination concentration = 4 × 10$^{12}$ (cm$^{-3}$)
D.L.: detection lower limit value or less It is understood from the above that the multi-layered silicon wafer described in Example 1 of the present invention has strong gettering capability.

Note that the present invention is not limited to the embodiments described above. The embodiments described above are merely illustrative and all such equivalences that have substantially the same structure as the technical concept described in CLAIMS of the present invention so as to provide the similar actions and effects are encompassed in the technical scope of the present invention.

For example, in Examples described above, the high concentration boron substrate is used as the first gettering layer, but the first gettering layer may be an IG wafer having high BMD density. Also, the boron is used as the ion-implantation seed for the second gettering layer, but other elements fall under the category of the present invention as long as the similar capability can be exhibited. Further, the second gettering layer is not limited to the ion-implantation layer, and an RTA method and heat treatment can be also effectively employed as long as a high BMD density layer can be formed at the depth position of the second gettering layer.

The invention claimed is:

1. A manufacturing method for a thin film silicon wafer which has gettering capability even after having been reduced in thickness to be in a thin film form and includes a device layer having a front device layer surface and a rear device layer surface disposed opposite the front device layer surface, the manufacturing method comprising the steps of:
    forming a first gettering layer on the rear device layer surface, the first gettering layer being fabricated from a first gettering material;
    forming a second gettering layer on the first gettering layer, the second gettering layer being fabricated from a second gettering material being different from the first gettering material thereby forming a unitary structure having the first gettering layer sandwiched between and in facial contact with the rear device layer surface and the second gettering layer;
    fabricating a device on the front device layer surface of the device layer; and
    after the device has been fabricated, removing the second gettering layer so as to leave the first gettering layer in place and in facial contact with the rear device layer surface of the device layer.

2. A manufacturing method according to claim 1, wherein one of the first and second gettering layers is fabricated from either a high concentration $p^+$ boron material or a material having a high density of bulk micro defects and a remaining one of the first and second gettering layers is fabricated from an ion-implantation material.

3. A manufacturing method for a multi-layered silicon wafer including a device layer having a front device layer surface and a rear device layer surface disposed opposite the front device layer surface, the manufacturing method comprising the steps of:
    forming a first gettering layer on the rear device layer surface, the first gettering layer being fabricated from a first gettering material;
    forming a second gettering layer on the first gettering layer, the second gettering layer being fabricated from a second gettering material being different from the first gettering material thereby forming a unitary structure having the first gettering layer sandwiched between and in facial contact with the rear device layer surface and the second gettering layer;
    fabricating a device on the front device layer surface of theof the device layer;
    after the device has been fabricated, capturing impurity elements within the first and second gettering layers by performing gettering heat treatment;
    after the gettering heat treatment has been performed, removing the second gettering layer so as to leave the first gettering layer in place and in facial contact with the rear device layer surface of the device layer; and
    laminating a plurality of the thin film silicon wafers, to thereby manufacture the multi-layered silicon wafer.

4. A manufacturing method according to claim 3, wherein one of the first and second gettering layers is fabricated from either a high concentration $p^+$ boron material or a material having a high density of bulk micro defects and a remaining one of the first and second gettering layers is fabricated from an ion-implantation material.

* * * * *